United States Patent [19]
Juhola et al.

[11] Patent Number: 5,636,762
[45] Date of Patent: *Jun. 10, 1997

[54] SYSTEM AND METHOD FOR DISPENSING LIQUID FROM STORAGE CONTAINERS

[75] Inventors: Bruce M. Juhola, Atherton; Ian P. Raphael, Los Gatos, both of Calif.

[73] Assignee: Microbar Systems, Inc., Santa Clara, Calif.

[ * ] Notice: The term of this patent shall not extend beyond the expiration date of Pat. No. 5,383,574.

[21] Appl. No.: 375,349

[22] Filed: Jan. 19, 1995

Related U.S. Application Data

[63] Continuation-in-part of Ser. No. 93,385, Jul. 19, 1993, Pat. No. 5,383,574.

[51] Int. Cl.$^6$ .............................. B67D 1/00; G01F 11/00
[52] U.S. Cl. .............................. 222/1; 137/205; 137/413; 222/56; 222/61; 222/64; 222/136; 222/152
[58] Field of Search .............................. 222/1, 56, 64–67, 222/61, 63, 136, 145, 152; 141/65–67; 137/205, 392, 413

[56] References Cited

U.S. PATENT DOCUMENTS

| | | | |
|---|---|---|---|
| 3,876,107 | 4/1975 | Meindl et al. | 222/64 |
| 4,106,671 | 8/1978 | Sharples | 222/64 X |
| 4,247,018 | 1/1981 | Credle | 222/64 X |
| 4,560,089 | 12/1985 | McMillin et al. | 222/56 X |
| 4,601,409 | 7/1986 | DiRegolo | 222/56 X |
| 5,316,181 | 5/1994 | Burch | 222/56 X |
| 5,383,574 | 1/1995 | Raphael | 222/56 X |

*Primary Examiner*—Kevin P. Shaver
*Attorney, Agent, or Firm*—Flehr Hohbach Test Albritton & Herbert LLP

[57] ABSTRACT

A system for dispensing liquid from first and second containers is disclosed herein. The liquid dispensing system includes a first media transfer line, positioned in liquid-flow communication with the first container, for transferring liquid from the first container. A second media transfer line, positioned in liquid-flow communication with the second container, is disposed to transfer liquid from the second container. When placed in a first state a switchable valve prevents liquid from flowing through the first media transfer line and allows liquid to flow through the second media transfer line. In a second state the switchable valve prevents liquid from flowing through the second media transfer line while allowing liquid to flow through the first media transfer line. A liquid storage reservoir connected in liquid-flow communication with the switchable valve stores liquid received from the first and second media transfer lines by way of the switchable valve. A transfer line sensor arrangement monitors the first and second media transfer lines for the presence of liquid therein, and generates a first switching signal when liquid becomes absent from the first media transfer line and a second switching signal when liquid becomes absent from the second media transfer line. The switchable valve is switched to the first state in response to the first switching signal and to the second state in response to the second switching signal. A vacuum generator is disposed to remove gas from the liquid storage reservoir above the level of liquid therein.

18 Claims, 8 Drawing Sheets

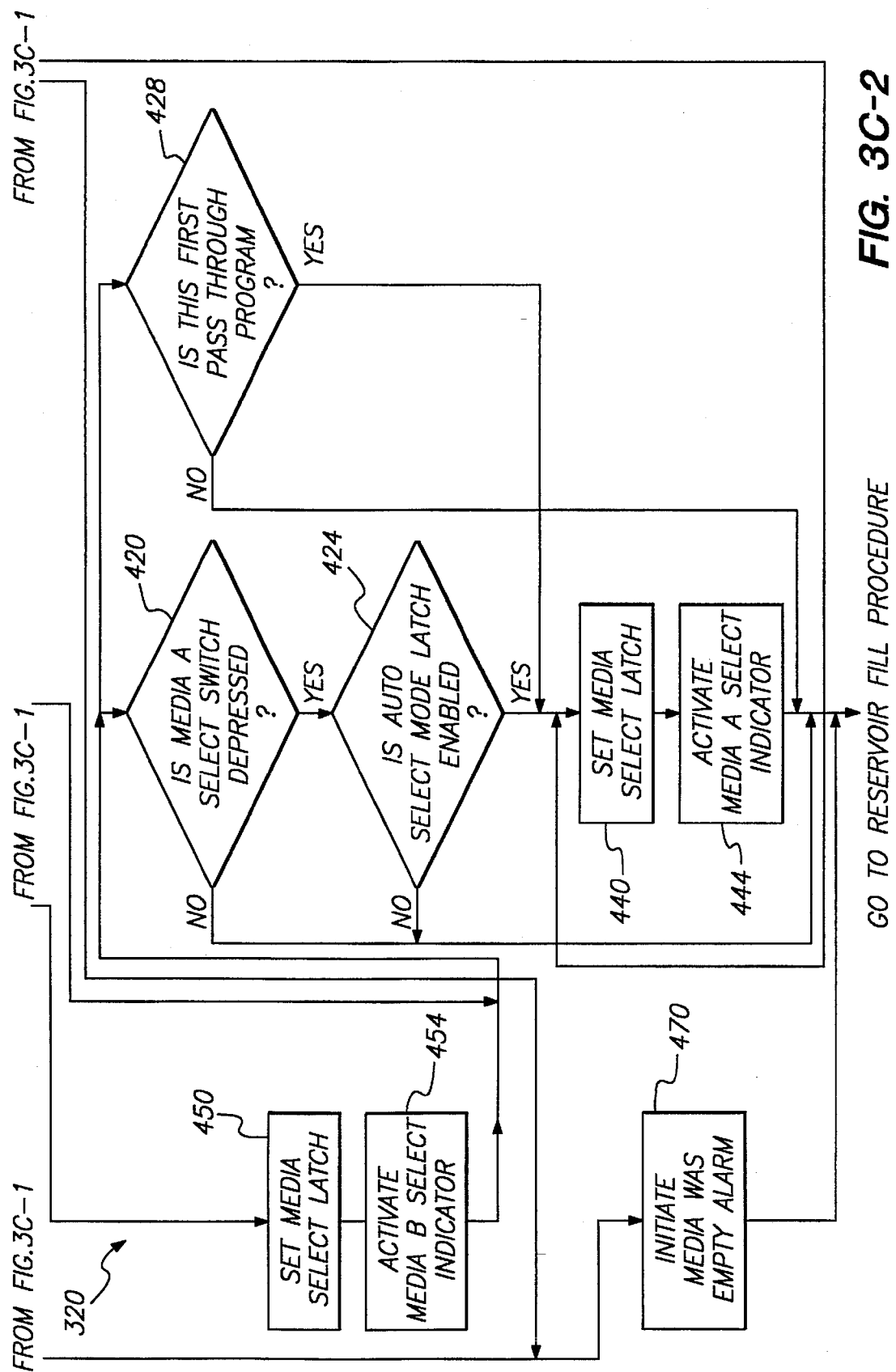

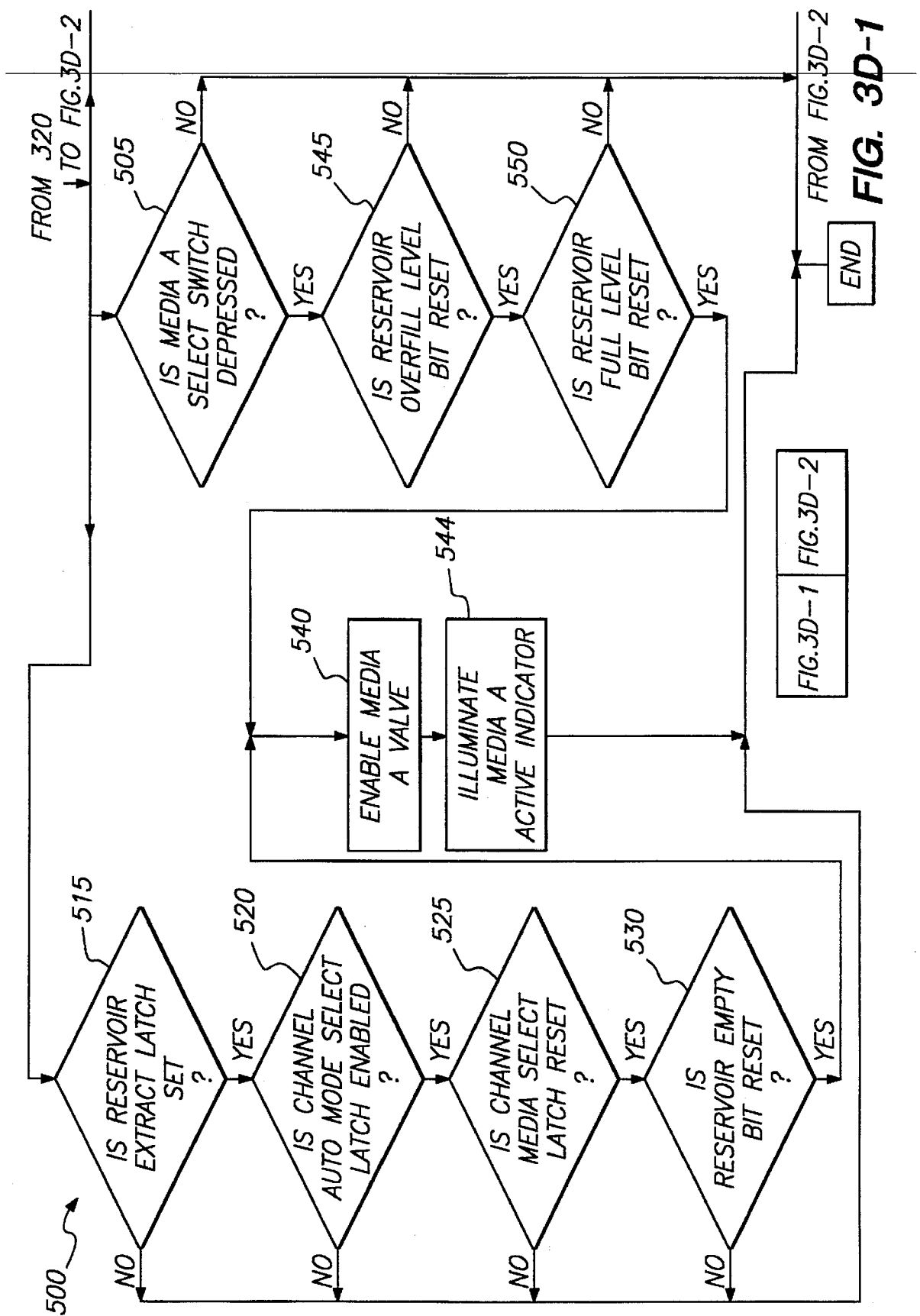

SYSTEM AND METHOD FOR DISPENSING LIQUID FROM STORAGE CONTAINERS

This application is a continuation-in-part of application Ser. No. 08/093,385, filed Jul. 19, 1993 and now U.S. Pat. No. 5,383,574.

The present invention relates generally to systems for dispensing liquids such as liquid chemicals, and particularly to systems disposed to automatically switch between at least a pair of liquid source containers.

BACKGROUND OF THE INVENTION

As is well known, large numbers of integrated circuit elements are often fabricated on a single semiconductor substrate wafer. In order to maximize the yield of the wafer, i.e., the percentage of non-defective circuit elements, it is essential to precisely control the processing environment. This is of particular importance during photolithographic processing. As an initial step in such processing the wafer is coated with a photosensitive layer using a liquid chemical such as photoresist. A desired circuit pattern is then defined by:

(i) selectively exposing the photosensitive layer by illuminating a mask using light of a specific wavelength and intensity, and (ii) removing unexposed portions of the photosensitive layer using, for example, chemical etchants.

Since the portion of an integrated circuit underlying a coated area of the wafer can be destroyed if exposed to chemical etchants, acceptable wafer yields require that the coated area be virtually free of discontinuities. Such discontinuities are known to arise, for example, as a consequence of air bubbles present in photoresist dispensing systems. Hence, wafers tend to be destroyed, and wafer yields thereby degraded, in proportion to the relative amount of air present within the dispensed photoresist. In manual dispensing systems the photoresist liquid is generally drawn from a small bottle or container which must be replaced when empty. However, during manual replacement of the photoresist container there is a tendency for air to become trapped in various supply lines of the dispensing system. That is, if a container becomes completely empty before a change is made air will be introduced into the dispensing system. This can cause discontinuities in the photoresist layer, and requires that a purging procedure be performed to rid the system of the unwanted air. Such a purging operation wastes residual photoresist present within the dispensing lines and reduces production efficiency. In addition, unwanted air within the dispensing system can result in particle formation due to oxidation of the surface of the photoresist. As is well known, the presence of such particles within the photoresist can create defects or discontinuities in the circuit lines defined on the wafer.

As photoresist and other processing liquids have become more expensive, it has become apparent that the waste of processing liquids during manual dispensing operations can significantly increase the cost of wafer processing.

OBJECTS OF THE INVENTION

One object of the present invention is to provide a liquid dispensing system which reduces the possibility of ambient air surrounding the system being introduced therein.

Another object of the present invention is to provide a system for dispensing liquid chemicals capable of automatically switching between supply containers in a manner which minimizes waste of such chemicals, and which reduces the possibility of air becoming entrapped therein.

Yet another object of the present invention is to provide a system for dispensing an uninterrupted supply of liquid chemicals substantially uncontaminated by ambient air.

SUMMARY OF THE INVENTION

In summary, the present invention is a system for dispensing liquid from first and second containers. The liquid dispensing system of the present invention includes a first media transfer line, positioned in liquid-flow communication with the first container, for transferring liquid from the first container. A second media transfer line, positioned in liquid-flow communication with the second container, is disposed to transfer liquid from the second container. When placed in a first state a switchable valve prevents liquid from flowing through the first media transfer line and allows liquid to flow through the second media transfer line. In a second state the switchable valve prevents liquid from flowing through the second media transfer line while allowing liquid to flow through the first media transfer line. A liquid storage reservoir connected in liquid-flow communication with the switchable valve stores liquid received from the first and second media transfer lines by way of the switchable valve. A transfer line sensor arrangement monitors the first and second media transfer lines for the presence of liquid therein, and generates a first switching signal when liquid becomes absent from the first media transfer line and a second switching signal when liquid becomes absent from the second media transfer line. The switchable valve is switched to the first state in response to the first switching signal and to the second state in response to the second switching signal. A vacuum generator is disposed to remove gas from the liquid storage reservoir above the level of liquid therein.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
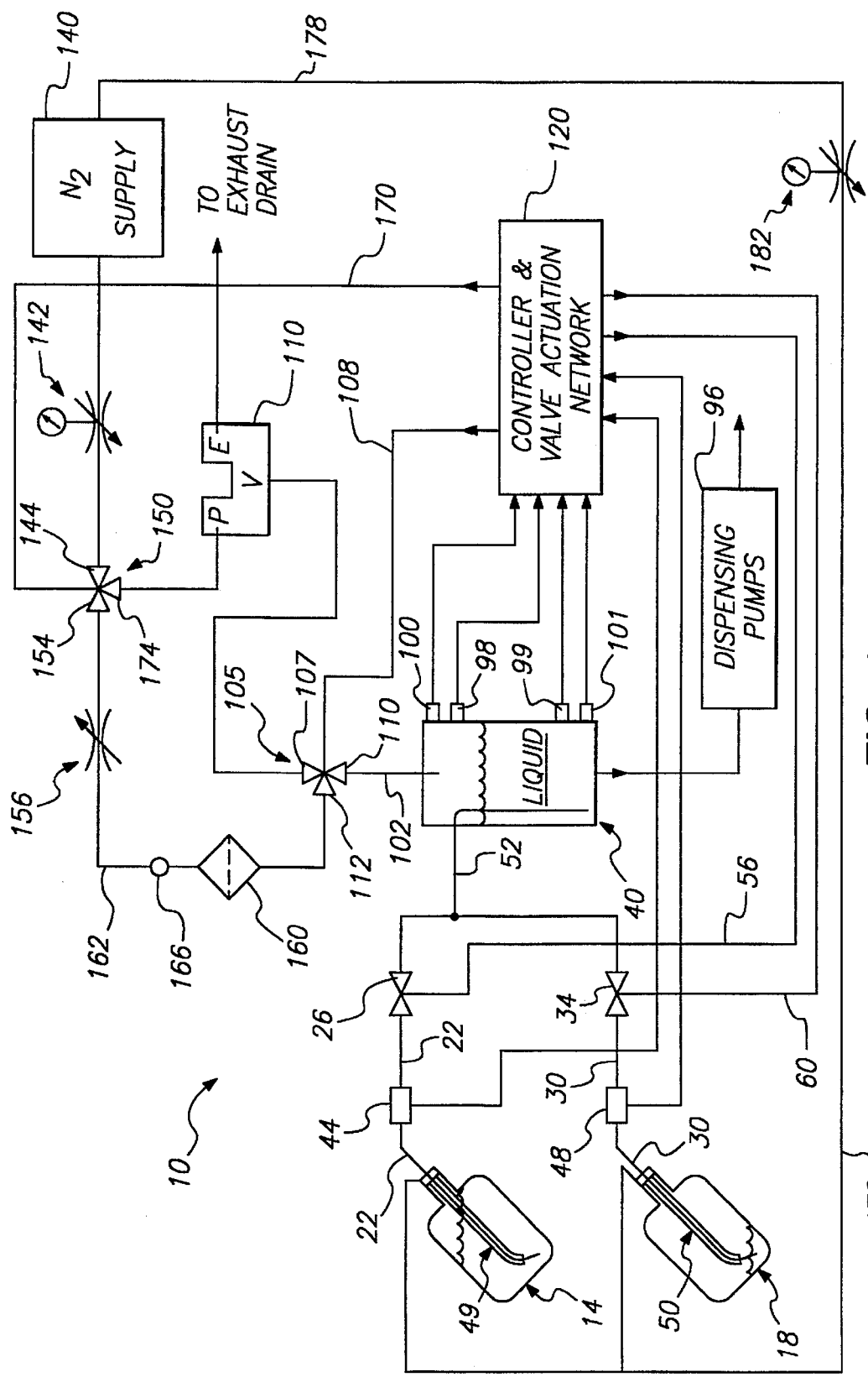
FIG. 1 is a block diagrammatic representation of a preferred embodiment of a system for dispensing liquids, such as semiconductor processing chemicals, from first and second liquid media containers.

Referring to FIG. 1, there is shown a preferred embodiment of a system 10 for dispensing liquids, such as semiconductor processing chemicals, from first and second liquid media containers 14 and 18. The system 10 is operative to dispense liquid from either the first container 14 or second container 18 until the liquid therein is depleted, and to then automatically switch to dispensing liquid from the other. Liquid is withdrawn from the first container 14 via a first media supply line 22 in liquid-flow communication with a first valve 26, while a second media supply line 30 in liquid-flow communication with a second valve 34 is disposed to withdraw liquid from the second media container 18. In the preferred embodiment of FIG. 1 the valves 26 and 34 are pneumatically-controlled, and serve to selectively permit liquid to flow from the containers 14 and 18 to a liquid reservoir 40.

More specifically, when liquid is being withdrawn from the first container 14 the second valve 34 operates to prevent liquid from flowing through the second media supply line 30. In this way the second container 18 may be replenished with liquid without interrupting the flow of liquid to the reservoir 40. Likewise, when the first container 14 becomes empty the first valve 26 is automatically closed, and the second valve 34 contemporaneously opened, so as to allow the liquid within the first container 14 to be replenished. The valves 26 and 34 may be implemented using, for example, 2-way pneumatic valves of the type manufactured by Fluoroware Inc., of Chaska, Minn., Part No. PV2-1144.

As is described more fully below, first and second optical flow-through sensors 44 and 48 are disposed to electronically signal when the containers 14 and 18 become empty by monitoring the media supply lines 22 and 30, respectively, for the presence of photoresist. That is, the presence of nitrogen gas within one of the media supply lines indicates that the corresponding container 14, 18 in liquid-flow communication therewith is empty. In this way the valves 26 and 34 may be controlled so as to prevent nitrogen gas from reaching the reservoir 40 during switching between the containers 14 and 18.

Each of the optical sensors 44 and 48 will preferably include, for example, a photometric device such as a Photomicrosensor, Part No. EE-SPX403, manufactured by Omron Electronics Inc., of Schaumburg, Ill., capable of discerning the presence of opaque liquid material within the supply line or conduit being monitored. In the preferred embodiment the photometric device is mounted within a housing, through which also extends the liquid supply line or conduit being monitored. In this implementation the liquid supply lines or conduits are realized using optically transparent tubing, e.g., Teflon tubing, so as to enable light emitted by the photometric device to interact with liquid present therein. Hence, each of the supply lines or conduits may be monitored without interfering with the flow liquid through the system 10.

In the preferred embodiment of FIG. 1 the containers 14 and 18 are light-blocking glass or plastic containers suitable for storing semiconductor processing chemicals, such as photoresist. As shown in FIG. 1, media supply lines 22 and 30 are directed by guide tube assemblies 49 and 50 to extend proximate the bottom of the containers 14 and 18, respectively, so as to withdraw liquid from the lower portions thereof. In a first operative state of system 10, during which the first valve 26 is opened and the second valve 34 is closed, liquid is transferred from the first container 14 via supply line 22 and a reservoir feed line 52 to the reservoir 40. Likewise, in a second operative state liquid is carried from the second container 18 to reservoir 40 through valve 34 via the media transfer line 30 and reservoir feed line 52.

Referring to FIG. 1, pneumatic control of the valves 26 and 34 is effected in response to pressurized nitrogen gas carried by first and second conduits 56 and 60. Gas flow through the conduits 56 and 60, typically at a maximum pressure of 60 psi, is regulated by conventional electrically actuated solenoid valves within a controller and valve actuation network 120. It is understood that pressurized nitrogen gas is allowed to flow through the conduits 56 and 60 when solenoid valves in communication therewith are opened in response to electrical actuation by a controller 120.

Figure 2:
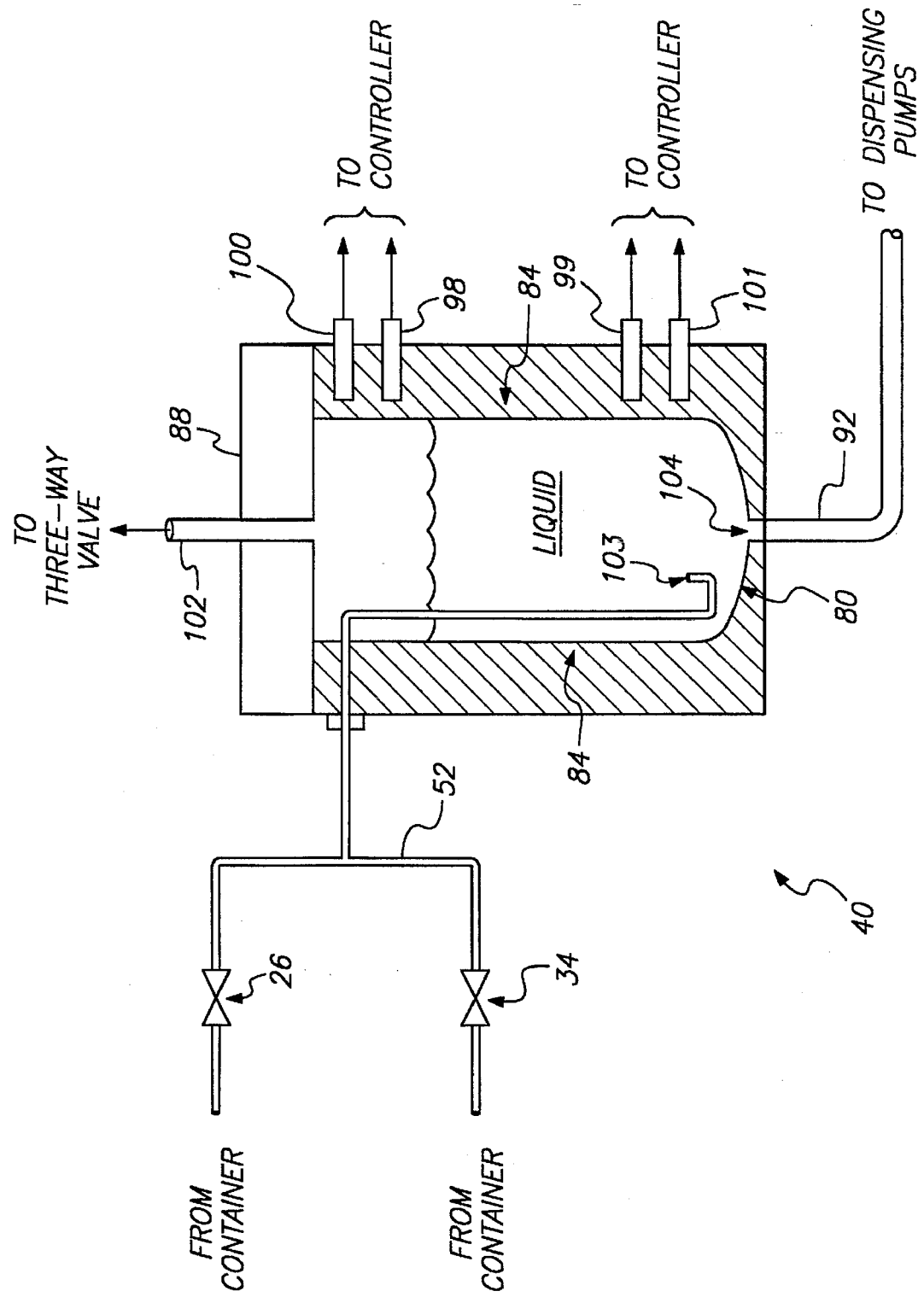
FIG. 2 shows a cross-sectional side view of a liquid reservoir included within the dispensing system of the invention.

Referring to FIG. 2, there is shown a cross-sectional side view of the reservoir 40. As shown in FIG. 2, the reservoir feed line 52 extends into a lower region of reservoir 40 from the valves 26 and 34. The reservoir 40 will typically have a liquid storage capacity of approximately 700 ml., and in the preferred embodiment of FIG. 1 includes a container defined by a bottom wall 80, a cylindrical sidewall 84, and an upper wall 88. A pump feed line 92 leading to one or more dispensing pumps 96 extends through the bottom wall 80, and is thereby in liquid-flow communication with the interior of the reservoir 40. High and low liquid-level sensors 98 and 99 are positioned on the sidewall 84, and respectively provide signals indicative of whether the liquid level within the reservoir exceeds a full level or is less than a low level. A redundant high-level (HI—HI) sensor 100 is positioned above the high level sensor 98, while a redundant low-level (LO—LO) sensor 101 is positioned below the low liquid-level sensor 99.

The sensors 100 and 101 enhance safety and prevent contamination by ensuring that the reservoir does not become either overfilled or completely empty. In particular, if the high liquid-level sensor 98 were to become inoperative the HI—HI sensor 100 would provide a signal in the event that the liquid within the reservoir 40 were to rise to the level thereof. In this way filling of the reservoir 40 would be suspended in a manner described hereinafter so as to prevent liquid from entering a gas withdrawal conduit 102. Similarly, the LO—LO sensor 101 is intended to signal when the reservoir 40 has become nearly empty in the case of failure of the low liquid-level sensor 99. In this way the LO—LO sensor 101 serves to prevent air or gas from being introduced into the pump feed line 92.

In a preferred implementation the HI—HI sensor 100 and LO—LO sensor 101 are positioned in close proximity, e.g., within 10 min., to the high and low liquid-level sensors 98 and 99, respectively. In addition, the reservoir 40 is designed in the preferred implementation such that a volume of approximately 35 ml. exists between the dispensing aperture 103 of the reservoir feed line 52 and the intake port 104 of the pump feed line 92. This ensures that the reservoir 40 will not become empty even if the liquid level therein drops to the position of the LO—LO sensor 101. Moreover, since gas bubbles emerging from dispensing aperture 103 will tend to rise upon being introduced into the reservoir 40, any such bubbles will be prevented from entering the pump feed line 92 through the intake port 104 thereof. In the preferred implementation the reservoir 40 is dimensioned so that:

a volume of approximately 60 ml. exists between the position of the low liquid-level sensor 99 and the dispensing aperture 103, a volume of approximately 450 ml. exists between the high and low liquid-level sensors 98 and 99, and the high liquid-level sensor 98 is separated from the upper wall 88 by a volume of approximately 90 ml.

Each of the sensors 98–101 may be implemented with, for example, a capacitive proximity sensor such as the Capacitive Proximity Sensor, Part No. E2K-F10MC2, manufactured by Omron Electronics, Inc. The sensors may be mounted external to the reservoir 40, and can detect the presence of liquid therein without the requirement that apertures be formed in the sidewall 84. The upper wall 88 includes an aperture through which extends a gas withdrawal conduit 102 disposed to place the interior of the reservoir 40 in gas-flow communication with first three-way pressure actuated valve 105. The three-way valve 105 is pneumatically controlled with pressurized gas, e.g., nitrogen, provided through pilot conduit 108.

Referring to FIG. 1, a normally-closed port 107 of the three-way valve 105 is in gas-flow communication with the vacuum port (V) of a conventional vacuum generator 110 such as is manufactured by Air Vac of Milford, Conn., Part No. AVR-038H. The port 107 will be opened when gas is being withdrawn from the reservoir 40 by the vacuum generator 110, and will be closed otherwise. A common port 110 of the three-way valve 105 is in continuous gas-flow communication with the interior of the reservoir 40 via the gas withdrawal conduit 102. When gas is not being withdrawn from the reservoir 40 through normally-closed port 107, nitrogen gas provided to a normally-open port 112 is bled into the reservoir 40 at slightly higher than atmospheric pressure through the common port 1 10.

The operation of the inventive dispensing system 10 may now be appreciated with reference to FIG. 1. In what follows it is to be remembered that the present invention contemplates that refilling of the reservoir 40 be carried out in accordance with the signals provided by the liquid-level sensors 98 and 99, while changeover between the containers 14 and 18 be governed by the signals generated by the first and second optical sensors 44 and 48.

Assume initially that the pumps 96 are withdrawing liquid from the reservoir 40, and that the reservoir 40 is concurrently being replenished by liquid from the first container 14. During this interval liquid is drawn into the reservoir 40 as a consequence of the reduced pressure created therein by the vacuum generator 110. Under these circumstances the controller and valve actuation network 120 pressurizes the conduit 108 so as to open the normally-closed port 107, and to close the normally-open port 112, of the first three-way valve 105. This places the interior of the reservoir 40 in gas flow communication with the vacuum port (V) of the vacuum generator 110 during the withdrawal of liquid from the containers.

Liquid is withdrawn from the container 14 until the sensor 98 signals controller 120 that the liquid level within the reservoir 40 reaches a reservoir full threshold. Controller 120 then electrically signals that the valve 26 and the port 107 be closed, which causes a suspension in gas pressurization of the conduits 56 and 108. This results in the closure of the first pneumatically-controlled valve 26 and the normally-closed port 107, thereby blocking liquid from container 14 from entering the reservoir 40 and preventing vacuum generator 110 from withdrawing gas therefrom.

As the pumps 96 continue to remove liquid from the reservoir 40, the liquid level therein will decrease until it falls below the level monitored by the second sensor 99. At this point the second sensor 99 signals the controller 120 that the reservoir 40 needs to be refilled. The controller 120 then initiates the refilling procedure in accordance with the container preference specified by an operator (not shown). For example, if the operator (not shown) indicates to the controller 120 that liquid from the first container 14 is to be used in replenishing the reservoir 40 and the optical sensor 44 indicates that liquid is present in media supply line 22, then controller 120 issues the electrical signals required to open the valve 26 and the normally-closed port 107, and to close the normally-open port 112. This induces pressurized nitrogen gas to flow through the conduits 56 and 108, and opens the pneumatically-controlled valve 26 and normally-closed port 107. In this way the container 14 is placed in liquid-flow communication with the interior of the reservoir 40, thus allowing gas to be withdrawn therefrom by vacuum generator 110 in order to provide suction for pulling liquid from the container 14 into the reservoir 40.

As part of the refilling procedure the signals generated by the flow-through optical sensors 44 and 48 are monitored by the controller 120 in order to determine whether liquid is available from either the first container 14 or the second container 18. If optical sensor 44 signals that liquid is absent from supply line 22, then controller 120 will be inhibited from pressurizing the conduit 56 and will provide an alarm signal indicating that the container 14 is empty. Similarly, if optical sensor 48 signals that liquid is absent from supply line 30 then controller 120 will be unable to pressurize conduit 60 and will provide an alarm signal indicating that the container 18 is empty.

Referring again to FIG. 1, the system 10 includes a source of pressurized nitrogen ($N_2$) gas 140 in gas-flow communication with a constant-pressure regulator and gauge 142. The gauge 142 will nominally be set to a pressure of approximately 60 psi., and is connected to the always-open common port 144 of a second three-way pressure actuated valve 150. Both the first and second three-way pressure actuated valves 105 and 150 can be implemented with, for example, a 3-way Venturi valve such that manufactured Clippard of Cincinnati, Ohio, Part No. CLP-2012. When the reservoir 40 is not being refilled by either the container 14 or by the container 18, the pressurized nitrogen provided by the source 140 is delivered through a normally-open port 154 of the valve 150 to a conventional adjustable needle valve 156. In a preferred implementation the needle valve 156 is set to approximately 3 psi., at a flow rate of 2 liter/min. As shown in FIG. 1, the needle valve 156 is in gas-flow communication with an $N_2$-gas filter 160 through a nitrogen supply line 162. The filter 160 may be implemented with, for example, a 0.1 or 0.2 μm gas filter such as is produced by Acrodisk of Ann Arbor, Mich., Part No. GEL-4225.

As is indicated in FIG. 1, the nitrogen supply line 162 defines an $N_2$ vent orifice 166 through which flows a portion of the $N_2$ gas stream. The $N_2$ gas emanated by the orifice 166 bathes the system 10 in inert nitrogen gas, and hence reduces the likelihood of contamination by non-inert gases within the surrounding atmosphere. The orifice 166 further serves to fix the pressure of the $N_2$ gas provided by the filter 160 to the normally-open port 112 at slightly higher than atmospheric pressure. This results in an $N_2$ gas stream being "bled" into the interior of the reservoir 40 when it is not being refilled, i.e., when it is isolated from the vacuum port (V) of vacuum generator 110 by the valve 105.

In contrast, during refilling of the reservoir 40 the network 120 pressurizes control conduit 170 so as to close the normally-open port 154 and open a normally-closed port 174 of the three-way valve 150. This directs the stream of $N_2$ gas from the regulator gauge 142 to a control port (P) of the vacuum generator 110, which induces a vacuum at the vacuum port (V). Any nitrogen gas withdrawn from the reservoir 40 by the vacuum generator 110, together with the stream of nitrogen gas incident on the control port (P), is dissipated through the exhaust port (E) of the vacuum generator 110.

The risk of contamination by non-inert gases within the surrounding atmosphere is further reduced by placing the source of nitrogen ($N_2$) gas 140 in gas-flow communication with the interior of the first and second containers 14 and 18. As is indicated by FIG. 1, the $N_2$ source 140 is coupled to the containers 14 and 18 through an $N_2$ supply line 178 and a constant-pressure regulator and gauge 182. The regulator 182 will typically be set to approximately atmospheric pressure. During refilling of the reservoir 40, nitrogen gas flows through the supply line 178 and fills the volume created within the container 14 or 18 due to recession of the level of the liquid therein.

Figure 3A:
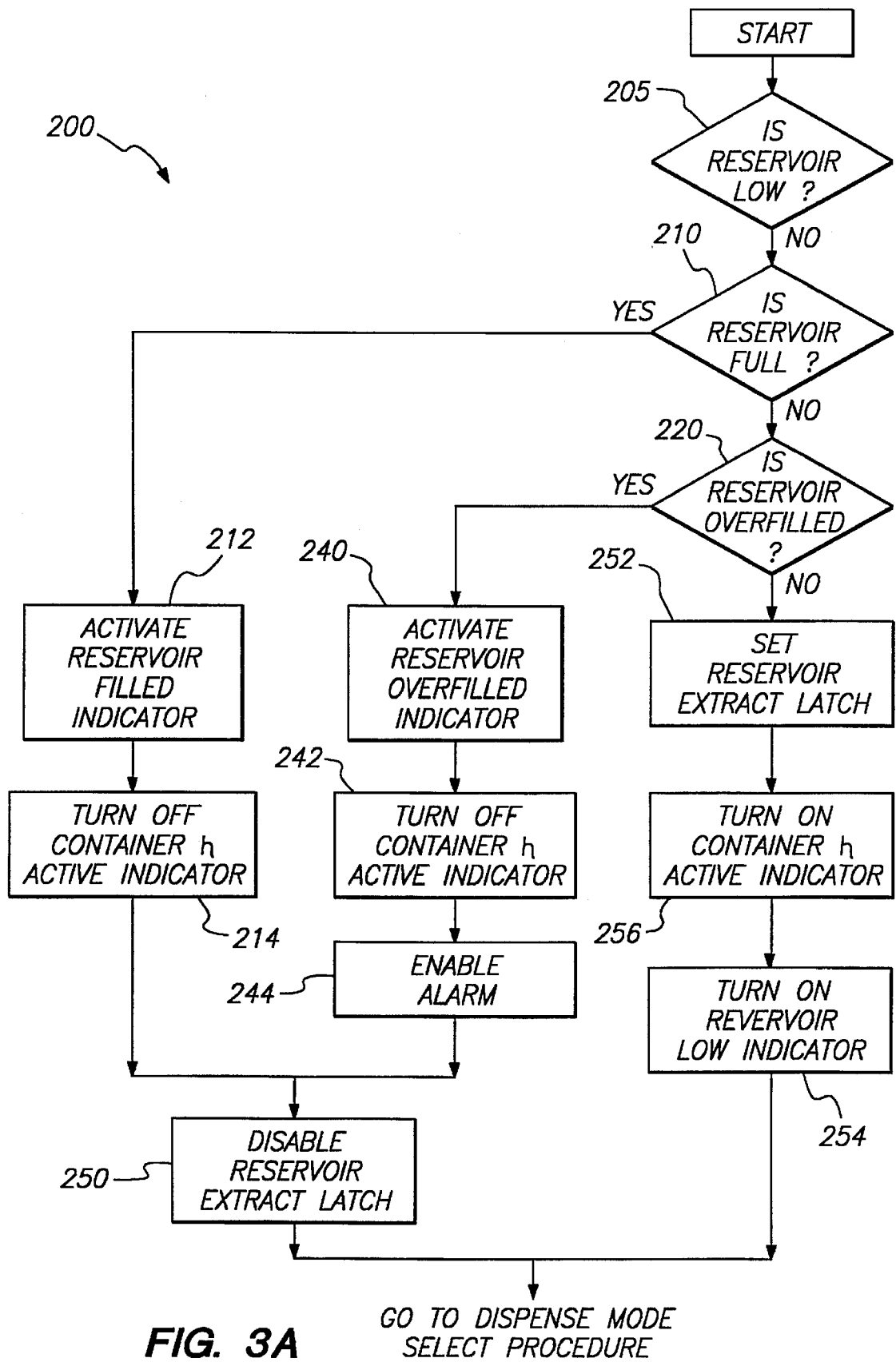
FIGS. 3A–3D are a set of flow charts outlining the procedure by which a liquid reservoir included within the dispensing system of FIG. 1 is refilled in accordance with the present invention.

FIGS. 3A–3D are a set of flow charts outlining the procedure by which the reservoir 40 is refilled in accordance with the present invention. As shown in FIG. 3A, the refill procedure is initiated by a reservoir extract routine 200. During the reservoir extract routine 200 a set of status indicators are activated in accordance with the level of liquid in the reservoir 40. For example, in step 210 if it is determined via sensor 98 that the reservoir 40 is full then a status indicator is updated in a step 212 to reflect that liquid is not being withdrawn from the liquid media container n selected by an operator. Similarly, if the sensor 100 indicates an overfill condition during step 220 then controller 120 activates the appropriate status indicator during a step 240 and generates an alarm signal 244. If either of these conditions exists then a reservoir extract latch within controller 120 is disabled in step 250. On the other hand, if it is ascertained that the reservoir is neither full nor overfilled a reservoir extract latch within controller 120 is set during step 252, a status indicator corresponding to a reservoir low condition is actuated 254, and the status indicator associated with container n is activated 256.

Figure 3B:
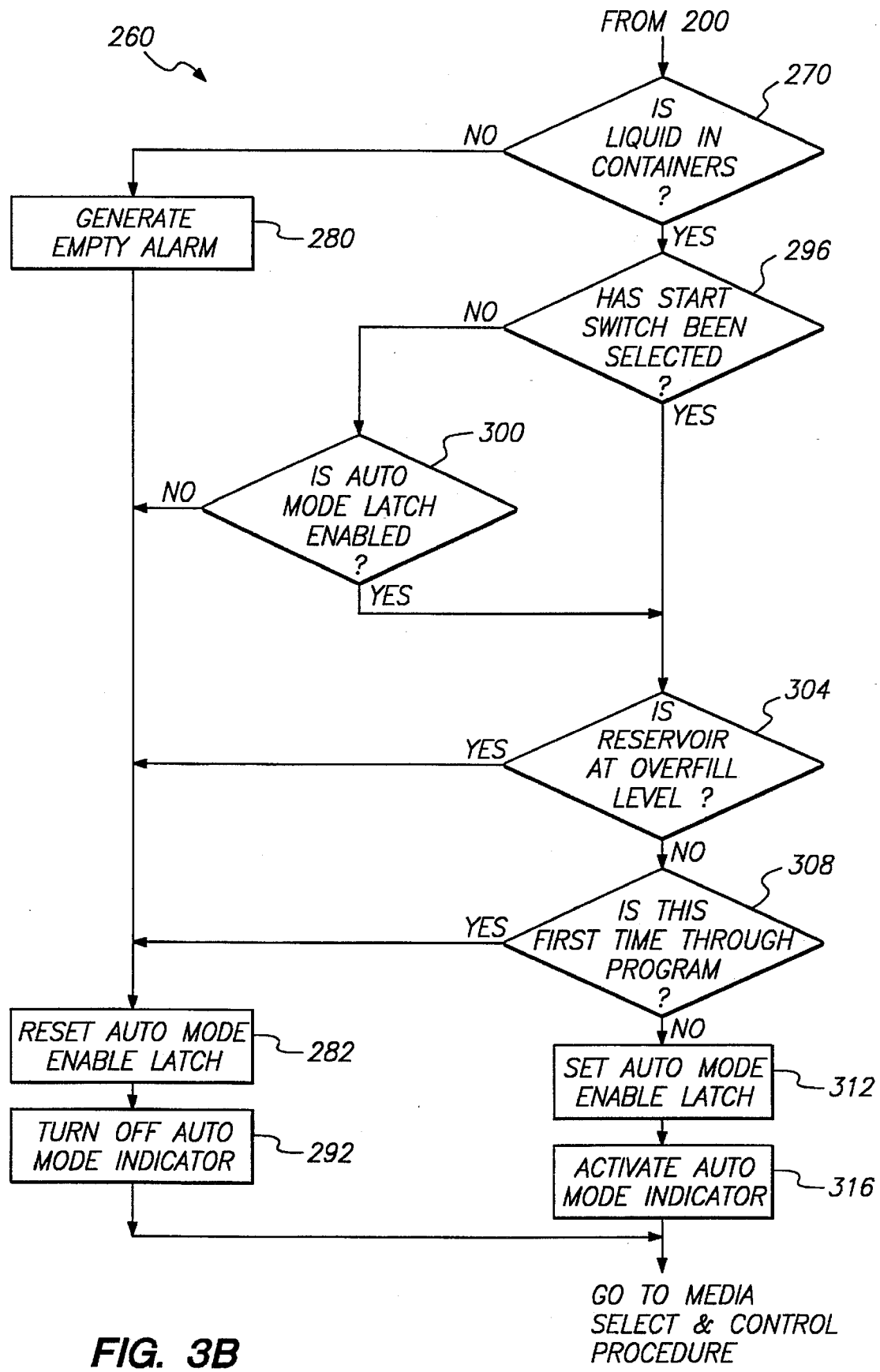

Referring to FIG. 3B, the reservoir extract routine 200 is followed by a dispense mode select procedure 260 in which it is determined if the system 10 is disposed to be placed in an auto dispense mode. The supply lines 22 and 30 are inspected in an initial step 270 to determine if liquid media is present in the containers 14 and 18. If not, the operator is alerted via generation of a container empty alarm signal 280. Otherwise, dispensing from the selected container is allowed to proceed following the setting of an auto mode enable latch in step 3 12.

Figures 1, 3C:
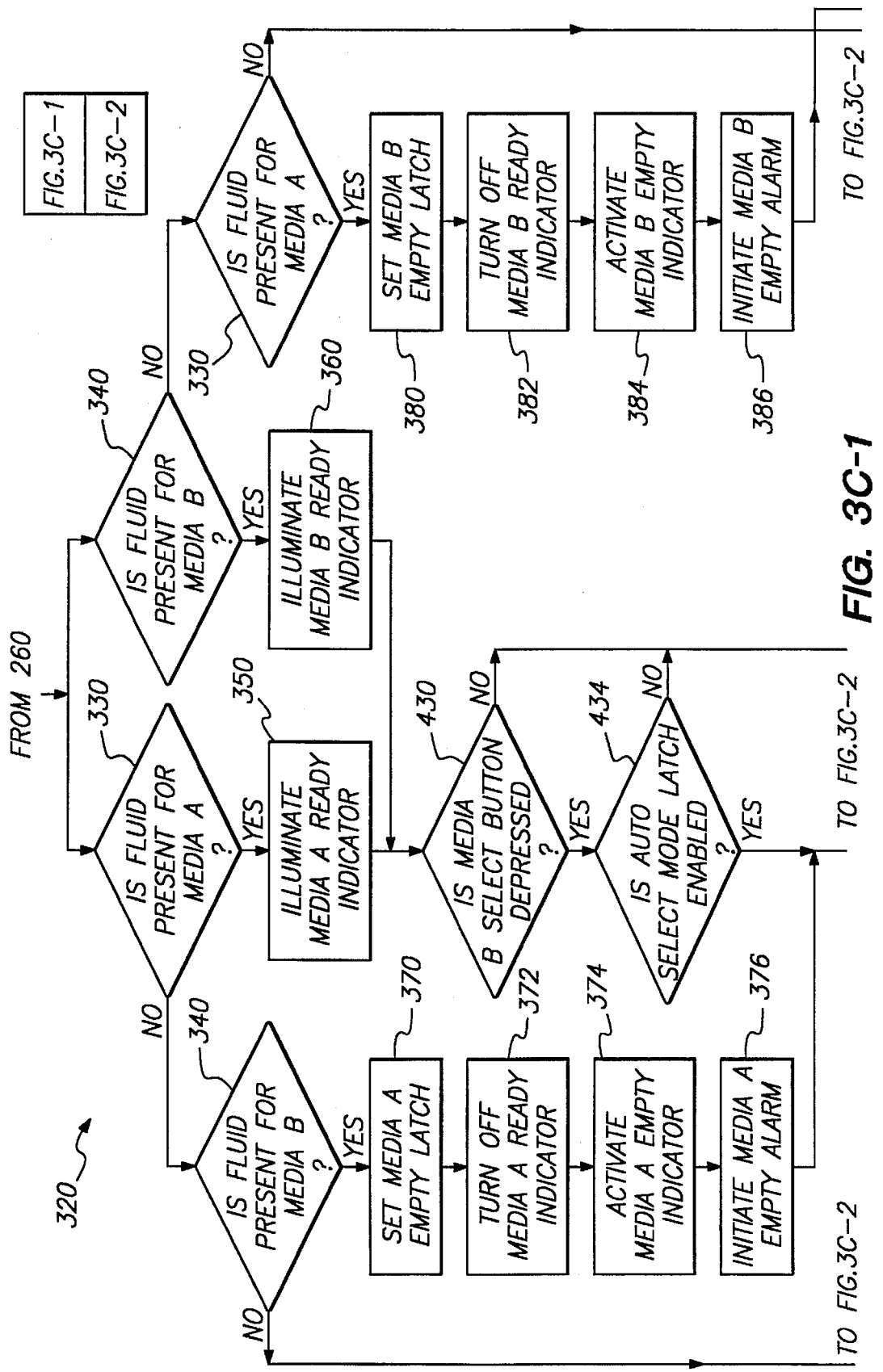

As shown in FIG. 3C, the dispense mode select procedure is followed by a media select and control procedure 320 during which liquid is dispensed from the container selected by the operator in the manner described above. For example, in steps 330 and 340 the signals from the flow-through sensors 44 and 48 are analyzed by controller 120 to determine if liquid media, i.e., MEDIA A and MEDIA B, is present within the first and second containers 14 and 18. If so, the appropriate status indicators are updated in steps 350 and 360 to reflect that dispensing may be carded out using MEDIA A or MEDIA B. If not, media empty latches within controller 120 are set in steps 370 and 380 to prevent dispensing from occurring from an empty container.

If fluid is determined to be present in the containers 14 and 18 during the steps 330 and 340, then controller 120 is interrogated during steps 420 and 430 in order to determine from which of the containers liquid is to be dispensed. Next, the media select latch within controller 120 corresponding to the container selected by the operator is set during steps 440 and 450. If gas is detected in the media supply lines 22 and 30 (FIG. 1) by the sensors 44 and 48 during the steps 330 and 340, then MEDIA A and MEDIA B empty alarms are actuated in step 470.

Figures 2, 3D:
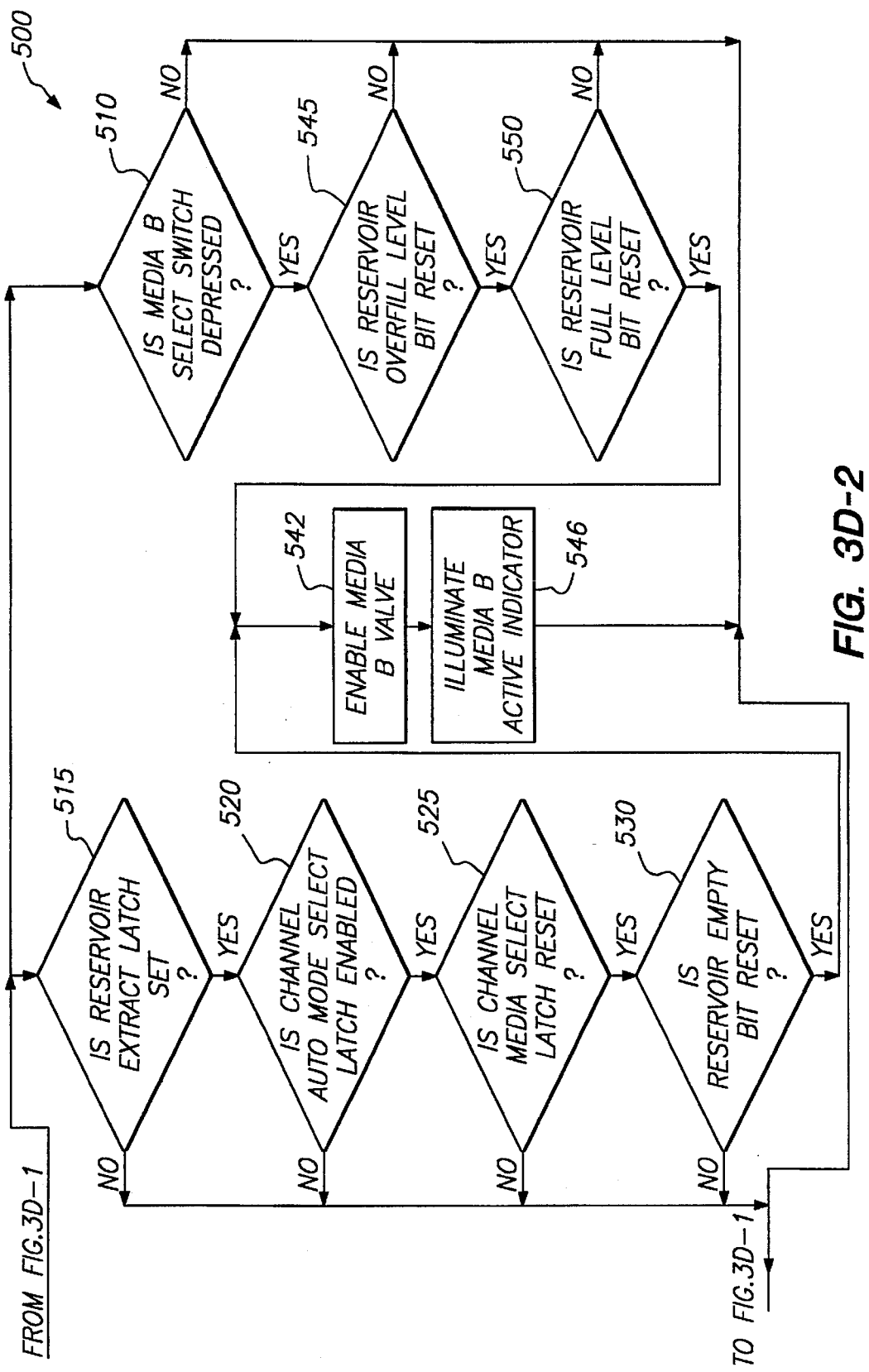

Referring to FIG. 3D, the reservoir 40 is filled in accordance with the steps included within a reservoir fill procedure 500. In steps 505 and 510 it is determined whether the first or second container 14 or 18 has been selected to serve as the source of liquid for the reservoir 40. Replenishing of the reservoir does not commence, however, until the reservoir extract latch, the auto mode select latch, and the media select latch for the selected container have been set in steps 515,520 and 525. In addition, it is determined whether the reservoir empty bit has been reset in step 530. Filling of the reservoir is then initiated in step 540 or step 542 if the reservoir 40 has been 'found not to be full (step 550), or overfilled (step 545).

While the present invention has been described with reference to a few specific embodiments, the description is illustrative of the invention and is not to be construed as limiting the invention. For example, although the preferred embodiment of FIG. 1 contemplates automatic switching between a pair of containers during refilling of the reservoir, alternative embodiments may employ only a single direct-dispense container. In such alternative embodiments the media supply line extending into the container would preferably be optically monitored, with refill of the reservoir being suspended if it is determined that gas is present therein, i.e., that the container has become empty. Various other modifications may occur to those skilled in the art without departing from the true spirit and scope of the invention as defined by the appended claims.

What is claimed is:

1. A system for dispensing liquid from first and second containers, comprising:

a first media transfer line, positioned in liquid-flow communication with said first container, for transferring liquid from said first container;

a second media transfer line, positioned in liquid-flow communication with said second container, for transferring liquid from said second container;

a source of inert gas in gas-flow communication with said first and second containers to provide backfilling of said containers with inert gas to isolate said system from the surrounding atmosphere;

a switchable valve for, in a first state, preventing liquid from flowing through said first media transfer line while allowing liquid to flow through said second media transfer line and for, in a second state, preventing liquid from flowing through said second media transfer line while allowing liquid to flow through said first media transfer line;

a liquid storage reservoir connected in liquid-flow communication with said switchable valve for storing liquid received from said first and second media transfer lines by way of said switchable valve;

reservoir level sensor means for monitoring the level of said liquid stored within said reservoir;

a pump for withdrawing liquid stored within said liquid storage reservoir;

container switching means for switching said switchable valve to said first state in response to removal of substantially all of said liquid from said first container, and for switching said switchable valve to said second state in response to removal of substantially all of said liquid from said second container; and a vacuum generator, responsive to said reservoir level sensor means, for inducing liquid to flow from said first and second transfer lines into said liquid storage reservoir in order to maintain the level of said liquid stored within said reservoir between upper and lower reservoir fill levels.

2. The system of claim 1 wherein said source of inert gas is in switchable gas-flow communication with said liquid storage reservoir for introducing a slightly higher than atmospheric pressure into said liquid storage reservoir.

3. The system of claim 1 wherein said source of inert gas is in gas-flow communication with said second container to provide backfilling of said container with inert gas.

4. The system of claim 1 wherein said container switching means includes:

a transfer line sensor arrangement for monitoring said first and second media transfer lines for the presence of liquid therein, and for generating a first switching signal when liquid becomes absent from said first media transfer line and a second switching signal when liquid becomes absent from said second media transfer line, valve switching means for switching said switchable valve to said first state in response to said first switching signal and for switching said switchable valve to said second state in response to said second switching signal, and a container selection switch for an operator to select a preferred container, allowing liquid to flow from said first container when said switch is in a first position, and allowing liquid to flow from said second container when said switch is in a second position.

5. The system of claim 1 wherein said reservoir level sensor means includes a plurality of upper and a plurality of lower sensors disposed at said upper and lower fill levels of said reservoir, said upper and lower fill levels being selected such that the volume within said reservoir therebetween substantially exceeds the volume within said reservoir below said lower fill level.

6. A system for dispensing liquid from first and second containers, comprising:

a first media transfer line, positioned in liquid-flow communication with said first container, for transferring liquid from said first container;

a second media transfer line, positioned in liquid-flow communication with said second container, for transferring liquid from said second container;

a switchable valve for, in a first state, preventing liquid from flowing through said first media transfer line while allowing liquid to flow through said second media transfer line and for, in a second state, preventing liquid from flowing through said second media transfer line while allowing liquid to flow through said first media transfer line;

a liquid storage reservoir connected in liquid-flow communication with said switchable valve for storing liquid received from said first and second media transfer lines by way of said switchable valve;

a source of inert gas in switchable gas-flow communication with said liquid storage reservoir, said first container and said second container;

reservoir level sensor means for monitoring the level of said liquid stored within said reservoir;

a pump for withdrawing liquid stored within said liquid storage reservoir;

a container switching arrangement for switching said switchable valve to said first state upon sensing the removal of substantially all of said liquid from said first container, and for switching said switchable valve to said second state upon sensing the removal of substantially all of said liquid from said second container; and a vacuum generator, responsive to said reservoir level sensor means, for inducing liquid to flow from said first and second transfer lines into said liquid storage reservoir in order to maintain the level of said liquid stored within said reservoir between upper and lower reservoir fill levels.

7. The system of claim 6 wherein said container switching arrangement includes:

a transfer line sensor arrangement for monitoring said first and second media transfer lines for the presence of liquid therein, and for generating a first switching signal when liquid becomes absent from said first media transfer line and a second switching signal when liquid becomes absent from said second media transfer line, and valve switching means for switching said switchable valve to said first state in response to said first switching signal and for switching said switchable valve to said second state in response to said second switching signal.

8. The system of claim 6 wherein said reservoir level sensor means includes upper and lower sensors disposed at said upper and lower fill levels of said reservoir, said upper and lower fill levels being selected such that the volume within said reservoir therebetween substantially exceeds the volume within said reservoir below said lower fill level.

9. A system for dispensing liquid from first and second containers, comprising:

first media transfer line means, positioned in liquid-flow communication with said first container, for transferring liquid from said first container;

second media transfer line means, positioned in liquid-flow communication with said second container, for transferring liquid from said second container;

a source of inert gas in gas-flow communication with said first and second containers for backfilling said containers with inert gas;

switchable valve means for, in a first state, preventing liquid from flowing through said first media transfer line means while allowing liquid to flow through said second media transfer line means and for, in a second state, preventing liquid from flowing through said second media transfer line means while allowing liquid to flow through said first media transfer line means;

a liquid storage reservoir connected in liquid-flow communication with said valve means for storing liquid received from said first and second media transfer line means by way of said valve means;

pump means for withdrawing liquid stored within said liquid storage reservoir;

transfer line sensor means for monitoring said first and second media transfer line means for the presence of liquid therein, and for generating a first switching signal when liquid becomes absent from said first media transfer line and a second switching signal when liquid becomes absent from said second media transfer line;

valve switching means for switching said valve means to said first state in response to said first switching signal and for switching said valve means to said second state in response to said second switching signal;

container selection switch for selecting said first or second container by an operator, withdrawing liquid from said first container when said switch is in a first position, and withdrawing liquid from said second container when said switch is in a second position;

means for inducing liquid to flow from said transfer line means into said liquid storage reservoir; and means for bathing said system with inert gas from said source to isolate said system from the surrounding atmosphere to prevent contamination.

10. The system of claim 9 further including a plurality of level sensors for monitoring the level of liquid within said storage reservoir, and for providing a reservoir low signal when the liquid level within said reservoir falls below a low level sensor.

11. The system of claim 10 wherein said means for inducing liquid to flow comprises a vacuum generator, said system further including first three-way valve means for placing said vacuum generator in gas-flow communication with said reservoir means upon receiving said reservoir low signal from said level sensing means.

12. The system of claim 11 wherein said source of inert gas is also in gas-flow communication with said second container to provide backfilling of said container with inert gas.

13. A system for dispensing liquid media from first and second containers comprising:

means for selectively transferring said media from either said first container through a first media transfer line, or from said second container through a second media transfer line, to a liquid storage reservoir;

a vacuum generator for inducing liquid to flow from said first and second media transfer lines into said liquid storage reservoir;

a source of inert gas in gas-flow communication with said first container for backfilling of said container with inert gas; and means for monitoring said transfer of media through said media transfer lines and switching liquid flow between said containers into said reservoir when media is not being transferred through one of said media transfer lines.

14. A method of dispensing liquid media from first and second containers comprising the steps of:

creating a vacuum to selectively transfer said media from either said first container through a first media transfer line, or from said second container through a second media transfer line, to a liquid storage reservoir;

placing a source of inert gas in gas-flow communication with said first container to provide backfilling of said container with inert gas; and monitoring said transfer of media through said media transfer lines and switching liquid flow between said containers into said reservoir when media is not being transferred through one of said media transfer lines.

15. The method of claim 14 further including the step of placing said source of inert gas in gas-flow communication with said second container to provide backfilling of said container with inert gas.

16. A method for dispensing liquid from first and second containers, comprising the steps of:

transferring liquid from said first container through a first media transfer line into a liquid storage reservoir;

placing a source of inert gas in gas-flow communication with said first container;

transferring liquid from said second container through a second media transfer line into said liquid storage reservoir;

creating a vacuum to induce liquid to flow from said media transfer lines into said liquid storage reservoir;

withdrawing liquid stored within said liquid storage reservoir;

generating a first switching signal when liquid becomes absent from said first media transfer line and a second switching signal when liquid becomes absent from said second media transfer line;

preventing liquid from flowing in said first media transfer line while allowing liquid to flow through said second media transfer line in response to said first switching signal, and preventing liquid from flowing in said second media transfer line while allowing liquid to flow in said first media transfer line in response to said second switching signal.

17. The method of claim 16 further including the step of placing said source of inert gas in gas-flow communication with said second container to provide backfilling of said container with inert gas.

18. A method for dispensing liquid from first and second containers, comprising the steps of:

transferring liquid from said first container through a first media transfer line into a liquid storage reservoir;

transferring liquid from said second container through a second media transfer line into said liquid storage reservoir;

withdrawing liquid stored within said liquid storage reservoir;

selectively introducing inert gas into said liquid storage reservoir, said first container and said second container;

selectively withdrawing said gas from within said liquid storage reservoir in order to induce liquid to flow from said first and second media transfer lines into said reservoir;

generating a first switching signal when liquid becomes absent from said first media transfer line and a second switching signal when liquid becomes absent from said second media transfer line;

preventing liquid from flowing in said first media transfer line while allowing liquid to flow through said second media transfer line in response to said first switching signal, and preventing liquid from flowing in said second media transfer line while allowing liquid to flow in said first media transfer line in response to said second switching signal.

* * * * *